United States Patent
Chang et al.

(10) Patent No.: US 9,811,709 B2
(45) Date of Patent: Nov. 7, 2017

(54) CAPACITOR SENSOR STRUCTURE, CIRCUIT BOARD STRUCTURE WITH CAPACITOR SENSOR, AND PACKAGE STRUCTURE OF CAPACITIVE SENSOR

(71) Applicant: MStar Semiconductor, Inc., Hsinchu Hsien (TW)

(72) Inventors: Ming-Chung Chang, Hsinchu County (TW); Tzu Wei Liu, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/193,585

(22) Filed: Jun. 27, 2016

(65) Prior Publication Data

US 2017/0017823 A1    Jan. 19, 2017

(30) Foreign Application Priority Data

Jul. 13, 2015 (TW) .............................. 104122620 A

(51) Int. Cl.
*H01L 23/495* (2006.01)
*G06K 9/00* (2006.01)
(Continued)

(52) U.S. Cl.
CPC ........ *G06K 9/0002* (2013.01); *H01L 23/4985* (2013.01); *H01L 23/49811* (2013.01); *H01L 23/49822* (2013.01); *H01L 23/49827* (2013.01); *H01L 23/49838* (2013.01); *H01L 23/16* (2013.01); *H01L 2224/16227* (2013.01); *H01L 2224/32225* (2013.01); *H01L 2224/32245* (2013.01); *H01L 2224/48091* (2013.01); *H01L 2224/48227* (2013.01); *H01L 2224/48235* (2013.01); *H01L 2224/73204* (2013.01); *H01L 2224/73215* (2013.01); *H01L 2224/73253* (2013.01); *H01L 2224/73265* (2013.01); *H01L 2224/92125* (2013.01); *H01L 2924/157* (2013.01); *H01L 2924/1579* (2013.01); *H01L 2924/15192* (2013.01);
(Continued)

(58) Field of Classification Search
CPC ............ G06K 9/0002; H01L 23/49827; H01L 23/49838; H01L 23/49822; H01L 23/49811; H01L 23/4985; H01L 2924/157; H01L 2924/15321; H01L 2924/15313; H01L 2924/15311; H01L 2924/15192; H01L 2224/92125
See application file for complete search history.

(56) References Cited

U.S. PATENT DOCUMENTS 9,281,339 B1 *   3/2016   Lin ....................... H01L 27/146
9,431,447 B2 *   8/2016   Kim .................. H01L 27/14618
(Continued)

FOREIGN PATENT DOCUMENTS

TW    201011660    3/2010
TW    M503617     6/2015

*Primary Examiner* — Dale E Page
*Assistant Examiner* — Wasiul Haider
(74) *Attorney, Agent, or Firm* — WPAT, PC

(57) ABSTRACT

A capacitive sensor structure includes: a substrate; a multilayer wire structure, disposed on the substrate to form a passive sensing circuit; and a semiconductor chip, formed thereon a control circuit, fixedly mounted on a surface of the substrate and electrically connected to the multilayer wire structure.

17 Claims, 11 Drawing Sheets

(51) Int. Cl.
*H01L 23/498* (2006.01)
*H01L 23/16* (2006.01)

(52) U.S. Cl.
CPC ........... *H01L 2924/15311* (2013.01); *H01L 2924/15313* (2013.01); *H01L 2924/15321* (2013.01); *H01L 2924/15787* (2013.01); *H01L 2924/181* (2013.01); *H01L 2924/19107* (2013.01)

(56) References Cited

U.S. PATENT DOCUMENTS

| | | | |
|---|---|---|---|
| 9,553,062 B1* | 1/2017 | Fan | H01L 24/08 |
| 2013/0081867 A1* | 4/2013 | Masuda | H01L 23/3677 174/260 |
| 2016/0171273 A1* | 6/2016 | Ho | G06K 9/0002 324/658 |
| 2016/0379036 A1* | 12/2016 | Long | G06K 9/00013 382/124 |

* cited by examiner

CAPACITOR SENSOR STRUCTURE, CIRCUIT BOARD STRUCTURE WITH CAPACITOR SENSOR, AND PACKAGE STRUCTURE OF CAPACITIVE SENSOR

This application claims the benefit of Taiwan application Serial No. 104122620, filed Jul. 13, 2015, the subject matter of which is incorporated herein by reference.

BACKGROUND OF THE INVENTION

Field of the Invention

The invention relates in general to a capacitive sensor structure, a circuit structure with a capacitive sensor and a package structure of a capacitive sensor, and more particularly, to a capacitive sensor structure, a circuit structure with a capacitive sensor and a package structure of a capacitive sensor applied to fingerprint recognition.

Description of the Related Art

With the popularity of portable devices, e.g., smart phones carried by almost everyone, a substantial amount of important information is integrated and carried therein. Thus, access security of portable devices has become highly concerned by users. Biometrics technologies, which use biological characteristics to verify the real identity of a user, are technical means under popularization. Biometrics technologies include face recognition, iris recognition, vein recognition and fingerprint recognition. Among the above, fingerprint recognition is the most common and low-cost technology. As human fingerprints almost do not change after adulthood and are unique to individuals, the chances of completely identical fingerprints are almost next to zero. Thus, fingerprints are very suitable for verifying a real user identity.

A fingerprint sensor commonly refers to a sensing element capable of converting a fingerprint structure to an electronic signal. The resolution of a fingerprint generally used in the fingerprint recognition technology needs to be capable of distinguishing two adjacent ridges of a fingerprint. Two ridges are spaced by about 300 μm to 500 μm, and a height difference between a ridge and a valley is about 100 μm to 400 μm. To correctly perform the recognition, a fingerprint image captured by a fingerprint sensor usually requires an area of 1 $cm^2$ and a resolution of 500 dpi.

Fingerprint sensors can be categorized into optical and capacitive types. Earlier fingerprint sensor technologies are mostly optical types, which collect digital grayscale images of ridges and valleys using capacitor coupling devices (CCD) or complementary metal oxide semiconductor (CMOS) image sensors. However, when fingerprint recognition is performed using optical fingerprint sensors, a higher recognition error may occur if a finger contains a slight scar or dust.

On the other hand, a capacitive fingerprint sensor is mainly formed by a sensor circuit and a controller circuit. The sensor circuit is a capacitor array formed by sensing electrodes. The controller circuit drives the sensor circuit and reads a capacitance change in the sensor circuit. The sensor circuit and the controller circuit of a conventional capacitive fingerprint sensor are both implemented by the same silicon chip, which is further provided with an insulation layer at a surface thereof. When a finger is placed on the capacitive fingerprint sensor, the distances from the ridges and valleys of the fingerprint to the sensing electrodes are different; hence, the ridges and valleys of the fingerprint generate different sensing capacitance values. As previously described, the fingerprint image captured by a fingerprint sensor usually requires an area of 1 $cm^2$. That is to say, a silicon chip implementing a conventional capacitive fingerprint sensor also requires an area of 1 $cm^2$. However, the area of a semiconductor chip and multiple mask high-end fabrication processes needed for completing the controller circuit contribute a major part of the cost of a circuit chip, meaning that conventional means for completing the silicon chip of a fingerprint sensor may result in an excessively large cost load. Therefore, there is a need for a capacitive fingerprint sensor applicable to a portable device or wearable device. It is a primary object of the present invention to solve the above issue.

SUMMARY OF THE INVENTION

The primary object of the present invention is to provide a capacitive sensor structure to cure defects of excessive costs of the prior art. Further, the capacitive sensor structure of the present invention may be broadly applied to wearable devices and portable devices in various and versatile appearances, and is capable of maintaining good design flexibilities.

To achieve the above object, the present invention provides a capacitive sensor structure including: a substrate; a multilayer wire structure, disposed in the substrate to form a passive sensing circuit; and a semiconductor chip, formed thereon a controller circuit, fixedly mounted on a surface of the substrate and electrically connected to the multilayer wire structure.

According to the above concept, in the capacitive sensor structure of the present invention, the substrate is one or a stack selected from a group consisting of an un-doped intrinsic semiconductor material, a precision high-purity alumina ceramic substrate, a packaging molding material, and a packaging liquid material.

According to the above concept, in the capacitive sensor structure of the present invention, the multilayer wire structure includes a plurality of sensing electrodes in the passive sensing circuit and a dielectric material among the sensing electrodes. The multilayer wire structure is completed by a redistribution layer (RDL) structure. The controller circuit completed on the semiconductor chip is a fingerprint sensing controller circuit.

According to the above concept, in the capacitive sensor structure of the present invention, the semiconductor chip is electrically in contact with the multilayer wire structure on the substrate by a flip-chip approach and via least one bonding pad structure. Between the semiconductor layer and the substrate is further filled by an under-fill adhesive layer. The substrate is further provided thereon at least one interconnection terminal and a stiffener metal ring.

According to the above concept, in the capacitive sensor structure of the present invention, the semiconductor chip is electrically in contact with the multilayer wire structure on the substrate by a flip-chip approach and via least one bonding pad structure. Between the semiconductor layer and the substrate is further filled by an under-fill adhesive layer. The substrate is further provided thereon at least one through-base via (TBV) to achieve electrical conduction between the multilayer wire structure and the semiconductor chip. A protection layer is further disposed above an upper surface of the substrate. The protection layer is completed by a ceramic adhesive layer and/or a hard coating material.

According to the above concept, in the capacitive sensor structure of the present invention, the substrate is further provided thereon at least one through-base via (TBV) to achieve electrical conduction between the multilayer wire structure and the semiconductor chip. The semiconductor chip is in electrical contact with the through-base via (TBV) on the substrate via at least one bonding wire. A protection layer is further disposed above an upper surface of the substrate. The protection layer is completed by a ceramic adhesive layer and/or a hard coating material.

The present invention further provides a circuit structure with a capacitive sensor. The circuit structure with a capacitive sensor includes: a substrate; a multilayer wire structure, disposed in the substrate to form a passive sensing circuit; a circuit board, including a first surface, a second surface and at least one via, the substrate disposed on the first surface; and a semiconductor chip, formed thereon a controller circuit, fixedly mounted on the second surface of the circuit board and electrically connected to the multilayer wire structure via the via.

According to the above concept, in the circuit board with a capacitive sensor of the present invention, the substrate is one or a stack selected from a group consisting of an un-doped intrinsic semiconductor material, a precision high-purity alumina ceramic substrate, a packaging molding material and a packaging gel liquid material.

According to the above concept, in the circuit board with a capacitive sensor of the present invention, the multilayer wire structure includes a plurality of sensing electrodes in the passive sensing circuit and a dielectric material among the sensing electrodes. The multilayer wire structure is completed by a redistribution layer (RDL) structure. The controller circuit formed on the semiconductor chip is a fingerprint sensing controller circuit.

According to the above concept, in the circuit board with a capacitive sensor of the present invention, the semiconductor chip is electrically in contact with the multilayer wire structure on the substrate by a flip-chip approach and via least one bonding pad structure. Between the semiconductor layer and the substrate is further filled by an under-fill adhesive layer.

According to the above concept, in the circuit board with a capacitive sensor of the present invention, the semiconductor chip is in electrical contact with the via on the circuit board via at least one first bonding wire. The first bonding wire and the semiconductor chip are enclosed by a protection structure.

According to the above concept, in the circuit board with a capacitive sensor of the present invention, the multilayer wire structure in the substrate includes a revealed bonding region, which is electrically connected to the first surface of the circuit board via a second bonding wire.

The present invention further provides a package structure of a capacitive sensor. The package structure of a capacitive sensor includes: a substrate; a multilayer wire structure, disposed in the substrate to form a passive sensing circuit; an organic substrate, the substrate disposed on its surface; and a semiconductor chip, formed thereon a controller circuit, fixedly mounted on the surface of the organic substrate and electrically connected to the multilayer wire structure.

According to the above concept, in the package structure of a capacitive sensor, the organic substrate includes a first surface and a second surface. The substrate is disposed above the first surface. A third surface of the semiconductor chip is fixedly connected to the substrate via a film-over-wire (FOW). A fourth surface of the semiconductor chip is fixedly mounted on the first surface. The multilayer wire structure in the substrate is electrically connected to the first surface via at least a first bonding wire, and the third surface of the semiconductor chip is electrically connected to the first surface via at least one second bonding wire.

According to the above concept, in the package structure of a capacitive sensor, the organic substrate includes a first surface and a second surface. The substrate is disposed above the first surface. The semiconductor chip is in electrical contact with the second surface of the organic substrate by a flip-chip method and via at least one bonding pad structure. The multilayer wire structure in the substrate is electrically connected to the first surface via at least one first bonding wire.

According to the above concept, in the package structure of a capacitive sensor, the package substrate is a flexible substrate including a first surface and a second surface. The substrate is disposed on the first surface. The semiconductor chip is in electrical contact with the second surface of the organic substrate by a flip-chip method and via at least one bonding pad structure. The multilayer wire structure in the substrate is electrically connected to the first surface via at least one first bonding wire.

According to the above concept, the package structure of a capacitive sensor further includes a support metal plate disposed at one side of the semiconductor chip.

According to the above concept, in the package structure of a capacitive sensor, the package substrate is a flexible substrate including a first surface and a second first surface. The substrate is disposed on the first surface. The semiconductor chip is in electrical contact with the first surface of the organic substrate by a flip-chip method and via at least one bonding pad structure. The multilayer wire structure in the substrate is electrically connected to the first surface via at least one first bonding wire.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 3l is a package structure associated with a capacitive sensor according to a seventeenth embodiment of the present invention;

DETAILED DESCRIPTION OF THE INVENTION

Technical features and advantages of the present invention are given in detail in the following non-limiting embodiments. It is to be understood that, various modifications may be made to the present invention without departing from the scope of the present invention. The description and drawings are for illustrating the present invention, and are not to be construed as limitations to the present invention.

Figure 1A:
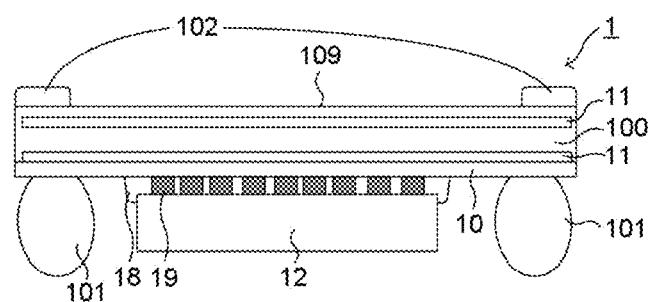
FIG. 1a is a schematic diagram of a capacitive fingerprint sensor developed for improving issues of the prior art according to a first embodiment of the present invention.

FIG. 1a shows a schematic diagram of a capacitive fingerprint sensor 1 developed for overcoming the issues of the prior art according to a first embodiment of the present invention. The capacitive fingerprint sensor 1 of the first embodiment mainly includes a substrate 10. The substrate 10 may be made of at least one selected from a group consisting of an un-doped intrinsic semiconductor material, e.g., silicon, aluminum oxide ($Al_2O_3$), a packaging molding compound, and a packaging liquid compound. Further, the substrate 10 may be made of a composite material such as a ceramic material, a packaging molding compound, a packaging liquid compound, or a packaging insulation resin material, coating and synthetic fiber to increase product manufacturing flexibilities.

A sensing circuit in the capacitive fingerprint sensor 1 is formed by a plurality of sensing electrodes and a dielectric material alternately disposed, and is thus a passive circuit having a less strict line width restriction. In the embodiment, a multilayer wire structure 11 is disposed on the substrate 10 to form sensing electrodes of the sensing circuit in the capacitive fingerprint sensor. The dielectric material 100 among the sensing electrodes may be made from the material of the substrate 10 or a re-processed product of that material. For example, the dielectric material 100 may be the intrinsic semiconductor material, ceramic material, packaging molding compound or packaging liquid compound described above, a silicon oxide material obtained from oxidizing silicon, or a compound material such as a packaging insulation resin material, coating and synthetic fiber. As the passive sensing circuit is primarily formed by conductive wires and does not include active circuits operable only when powered, it has lower production costs.

In one embodiment, the manufacturing of the multilayer wire structure 11 may be a redistribution layer (RDL) process as a main technical means. The RDL process requires only three mask processes and need not be manufactured in large-scale foundries established with high hardware costs. Therefore, compared to multiple high-end mask processes required by a controller circuit, the RDL process requires only significantly reduced working hours and complexity level that help in reducing product costs. In another embodiment, the multilayer wire structure 11 may be formed by other lower-end manufacturing processes as a main technical means, and is not limited to being manufactured by the RDL process.

Different from the multilayer wire structure 11 using a lower-end RDL process, the fingerprint sensing controller circuit in the capacitor fingerprint sensor, which is an active circuit, may use a high-end multi-mask process and be formed on the semiconductor chip 12. The semiconductor chip 12 may be packaged on the substrate 10, and be electrically connected to respective bonding pad structures 19 of the semiconductor chip 12 and the substrate 10. In the embodiment, the semiconductor chip 12 is electrically connected to the multilayer wire structure 11 on the substrate by a flip-chip method to jointly form the capacitive fingerprint sensor. Further, between the semiconductor chip 12 and the substrate 10 is filled with an under-fill adhesive layer 18 for ensuring the reliability. Further, an interconnection terminal 101 and a stiffener metal ring 102 may be further formed on the substrate 10. The interconnection terminal 101 is for electrically connecting to an external circuit board (not shown), and the stiffener metal ring 102 serves for package support and a ground path. In the embodiment, as the multilayer wire structure 11 is disposed below the upper surface 109 of the substrate 10, the upper surface 109 of the substrate 10 may be directly used as a location for placing fingers. Thus, such is referred to as a face-up type, which does not need an additional protection glass layer and is capable of effectively reducing production processes and costs.

As such, using the above manufacturing technologies and package structure, the capacitive fingerprint sensor 1 may be formed. In the capacitive fingerprint sensor 1, the multilayer wire structure disposed on the substrate 10 is implemented by a passive circuit having a less strict line width restriction. Thus, the required working hours and complexity level may be significantly lowered. Further, the top-down stacking method effectively shortens the transmission path between the semiconductor chip 12 and the multilayer wire structure 11, hence favoring maintaining the signal transmission quality.

Figure 1B:
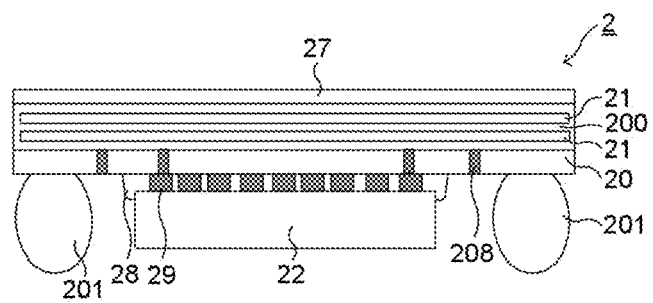
FIG. 1b is a schematic diagram of a capacitive fingerprint sensor according to a second embodiment of the present invention.

FIG. 1b shows a schematic diagram of a capacitor fingerprint sensor 2 developed for overcoming the issues of the prior art according to a second embodiment of the present invention. This embodiment is also a face-up type, and similarly includes a substrate 20. For example, the substrate 20 may be made of an un-doped intrinsic semiconductor material, e.g., silicon, aluminum oxide ($Al_2O_3$), a packaging molding compound, and a packaging liquid compound, or a combination of the above.

The sensing circuit of the embodiment is similarly a capacitor array formed by a plurality of sensing electrodes and a dielectric material alternately disposed. In the embodiment, a multilayer wire structure 21 is disposed on the substrate 20 to serve as sensing electrodes needed in a sensing circuit in a capacitive fingerprint sensor. A dielectric material 200 disposed among the sensing electrodes may similarly be made of the intrinsic semiconductor material, ceramic material, packaging molding compound or packaging liquid compound described above, or a silicon oxide material obtained from oxidizing silicon.

The multilayer wire structure 21 is also a multilayer wire structure formed by an RDL process. In this embodiment, one characteristic is that, the substrate 20 includes through-base vias (TBVs) 208 for conducting the multilayer wire structure with the semiconductor chip 22. Further, a protection layer 27 is further disposed above the multilayer wire structure. The protection layer 27 is implemented by a ceramic adhesive material and/or a hard coating material to prevent damages potentially incurred on the electrodes below by fingers.

Details of wire bonding pad structures 29, an under-fill adhesive layer 28 and an interconnection terminal 201 are identical to those in the first embodiment, and shall be omitted herein. Further, the stiffening metal ring may be omitted due to the protection layer 27 disposed. As such, not only the capacitive fingerprint sensor 2 of the second embodiment is capable of reducing required working hours and complexity level, but also the signal transmission path between the semiconductor chip 22 and the multilayer wire structure 21 may be similarly shortened to help in maintaining the signal transmission quality.

Figure 1C:
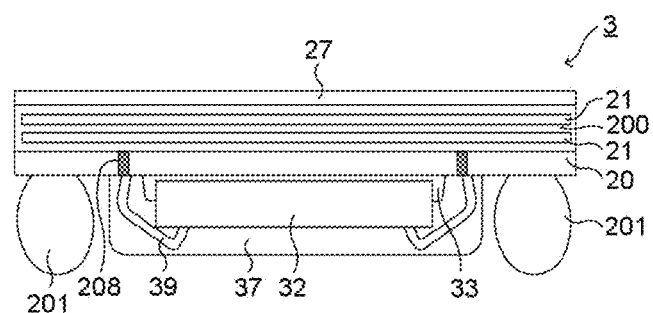
FIG. 1c is a schematic diagram of a capacitive fingerprint sensor according to a third embodiment of the present invention.

One difference between a third embodiment in FIG. 1c and the second embodiment is that, the flip-chip method is replaced by a bonding wire 39 that electrically connects a semiconductor chip 32 to the through-base vias (TBVs) 208 on the substrate 20, so as to form a capacitor fingerprint sensor 3 with the multilayer wire structure 21. A connecting material between the semiconductor chip 32 and the substrate 20 may be a simple insulation adhesive layer 33. Details of the remaining structures are substantially identical to those of the previous embodiment, and shall be omitted herein. Further, decorative patterns may be formed on the surface of the protection layer 27 by means such as printing, given the decorative patterns are formed using a non-conductive insulating paint. Thus, without affecting capacitive fingerprint recognition, a developer is provided with more room for creativity.

Figure 2A:
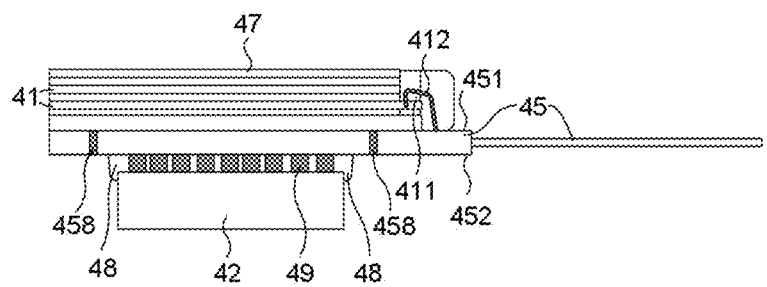
FIG. 2a is a circuit board structure with a capacitive sensor according to a fourth embodiment of the present invention.

FIG. 2a shows a schematic diagram applying the technical means of the present invention to an assembly of a circuit board with a capacitive fingerprint sensor according to a fourth embodiment. Basically, the combination of a protection layer 47, a substrate 40 and a multilayer wire structure 41 are conceptually the same as the structures in the first and second embodiments. However, in order to be disposed on a first surface 451 of a circuit board 45, modifications are made in this embodiment, as below. The multilayer wire structure 41 disposed on the substrate 41 includes a revealed bonding region 411, and is electrically connected to signal lines (not shown) on the circuit board 45 via a bonding wire 412 to be further connected to an external circuit (not shown). A semiconductor chip 42 is packaged on a second surface 452 of the circuit board 45, and the semiconductor chip 42 and the circuit board 45 are electrically connected via respective bonding pad structures 49. In this embodiment, the semiconductor chip 42 is electrically connected to a signal line (not shown) on the circuit board 45 by a flip-chip method, and between the semiconductor chip 42 and the circuit board 45 is filled with an under-fill adhesive layer 48 to ensure the reliability. Further, the circuit board 45 is provided with through-base vias (TBV) 458 for conducting the multilayer wire structure and the semiconductor chip 42 on two surfaces. Thus, the capacitive fingerprint sensor and a circuit board may be integrated into one module. For example, the printed circuit board may be a printed circuit board (PCB), a flexible printed circuit (FPC), or a rigid-flex printed circuit (RFPC).

Figure 2B:
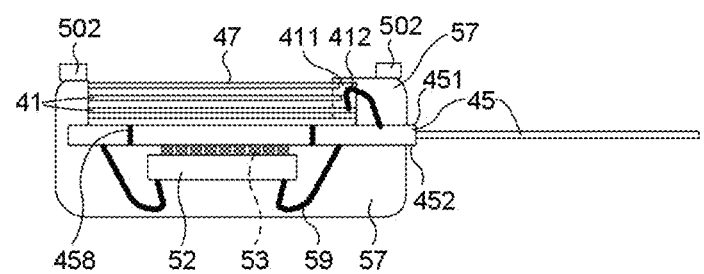
FIG. 2b is a circuit board structure with a capacitive sensor according to a fifth embodiment of the present invention.

FIG. 2b shows a schematic diagram applying the technical means of the present invention to an assembly of a circuit board with a capacitive fingerprint sensor according to a fourth embodiment. The multilayer wire structure 41 disposed on a substrate 40 similarly includes the revealed bonding region 411, and is electrically connected to a signal line (not shown) on the first surface 451 of the circuit board 45 via a bonding wire 412 to further connect to an external circuit (not shown). One difference of the structure of the fifth embodiment from that of the fourth embodiment is that, a protection structure 57, formed by a molding compound or a packaging liquid compound, is used to completely enclose a bonding wire 412, a semiconductor chip 52 and a bonding wire 59, while leaving only a location where a finger presses. The semiconductor chip 52 may be implemented by a flip-chip method or frontal connection, and electrically connect to the TBVs 458 in the circuit board 45 and via the bonding wire 59. Via the TBVs 458, the semiconductor chip 52 is further electrically connected to a signal line (not shown) on the first surface 451 and the multilayer wire structure 41. An insulation adhesive layer 53 between the semiconductor chip 52 and the circuit board 45 may be selected from different materials, depending whether the flip-chip or frontal connection method is utilized. Details of the remaining structures are substantially identical to those of the previous embodiment, and shall be omitted herein. The protection structure 57 may further include a stiffener metal ring 502 primarily serving for package support and a ground path.

Figure 3A:
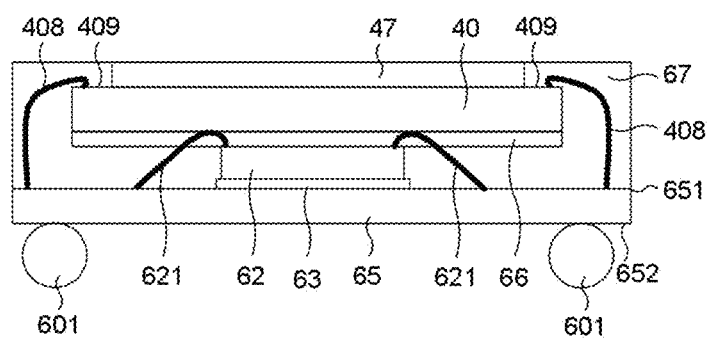
FIG. 3a is a package structure of a capacitive sensor according to a sixth embodiment of the present invention.

FIG. 3a shows a schematic diagram of a capacitive fingerprint sensor packaged with an organic substrate according to a sixth embodiment of the present invention. Basically, the combination of the protection layer 47, the substrate 40 and the multilayer wire structure (not shown) are conceptually identical to the structures in the first and second embodiments. A connecting material between a lower surface of a semiconductor chip 62 and an upper surface 651 on a double-sided thin substrate 65 implemented by an organic substrate may be a simple insulation adhesive layer 63. An upper surface of the semiconductor chip 62 and the substrate 40 may be joined by a film-over-wire (FOW) 66. A bonding wire 621 is partially enclosed by the FOW 66 but eventually penetrates out from the FOW 66 to be in electrical contact with a conducting wire (not shown) of the upper surface 651 of the double-sided thin substrate 65 implemented by an organic substrate. Further, the bonding region 409 not covered by the protection layer 47 is also in electrical contact with the conducting wire (not shown) on the double-sided thin substrate 65 implemented by an organic substrate via the bonding wire 408. Further, the bonding wires 408 and 621, the bonding region 409 and the surface of the double-sided thin substrate implemented by an organic substrate may be enclosed by a protection structure 67 formed by a molding compound or a packaging liquid compound, while revealing only the protection layer 47 for a finger to press upon. A bottom portion of the double-sided thin substrate 65 includes an interconnection terminal 601. The protection layer 47 may be a hard coating implemented by an additional ceramic adhesive, or may be completed using the same material when completing the above protection structure 67.

Figure 3B:
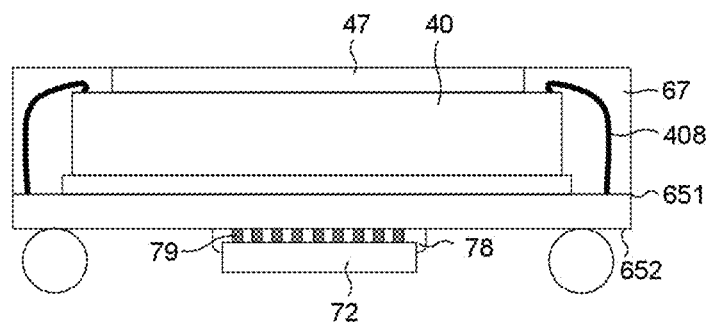
FIG. 3b is a package structure associated with a capacitive sensor according to a seventh embodiment of the present invention.

FIG. 3b shows a schematic diagram of a capacitive fingerprint sensor packaged with an organic substrate according to a seventh embodiment of the present invention. Basically, one difference between this embodiment and the sixth embodiment is that, a semiconductor chip 72 is electrically connected to a lower surface 652 of the double-sided thin substrate 65 implemented by an organic substrate by a flip-chip method and via respective bonding pad structures of the two. Further, the semiconductor chip 72 is electrically connected to a conduction hole (not shown) on the double-sided thin substrate 65 implemented by an organic substrate. Further, space between the semiconductor chip 72 and the lower surface 652 of the double-sided thin substrate 65 is filled with an under-fill adhesive layer 78 to ensure the reliability. Details of the remaining parts are substantially identical to the above embodiments, and shall be omitted herein. Similarly, the protection layer 47 in this embodiment may be a hard coating implemented by an additional ceramic adhesive, or may be completed using the same material when completing the above protection structure 67.

Figure 3C:
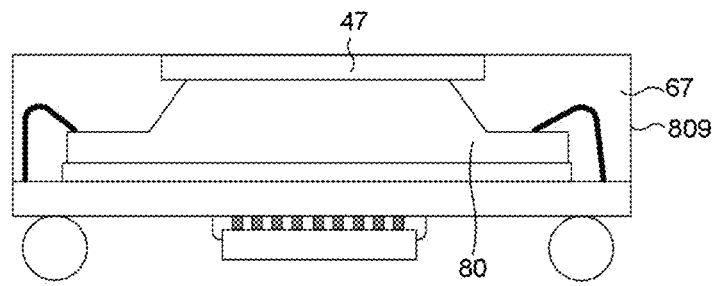
FIG. 3c is a package structure associated with a capacitive sensor according to an eighth embodiment of the present invention.

FIG. 3c shows a schematic diagram of a capacitive fingerprint sensor packaged with an organic substrate according to an eight embodiment of the present invention. Basically, one difference between this embodiment and the seventh embodiment lies in the structural appearances of the substrate 40 and the multilayer wire structure. In this embodiment, for a substrate 80 (a collective term of the substrate 40 and the multilayer wire structure), a bonding region 809 having a larger area but a smaller thickness is formed by etching technologies. Details of the remaining parts are identical to those in the seventh embodiment, and shall be omitted herein. The protection layer 47 in this embodiment may be a hard coating implemented by an additional ceramic adhesive, or may be completed using the same material when completing the above protection structure 67.

Figure 3D:
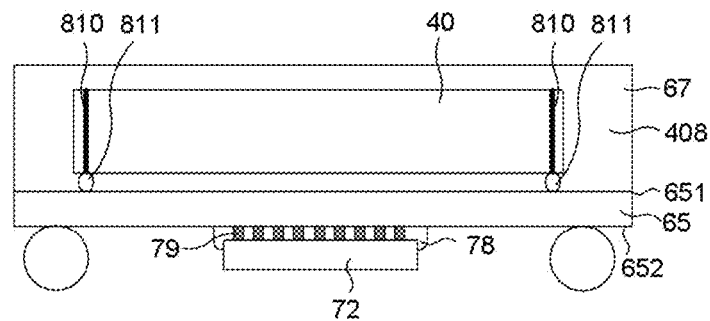
FIG. 3d is a package structure associated with a capacitive sensor according to a ninth embodiment of the present invention.

FIG. 3d shows a schematic diagram of a capacitive fingerprint sensor packaged with an organic substrate according to a ninth embodiment of the present invention. Basically, the structure of this embodiment is very similar to that of the seventh embodiment. One main difference is that, the original bonding wire 408 is replaced by a through-silicon via (TSV) 810 and a copper pillar structure 811 to complete the electrical connection between the multilayer wire structure (not shown) on the substrate 40 and the double-sided thin substrate 65 implemented by an organic substrate. The double-sided thin substrate 65 implemented by an organic substrate may be a low-cost double-sided substrate. Details of the remaining parts are substantially identical to those in FIG. 3b, and shall be omitted herein. The protection layer 47 in FIG. 3b is completed by the same material of the protection structure 67 in this embodiment.

Figure 3E:
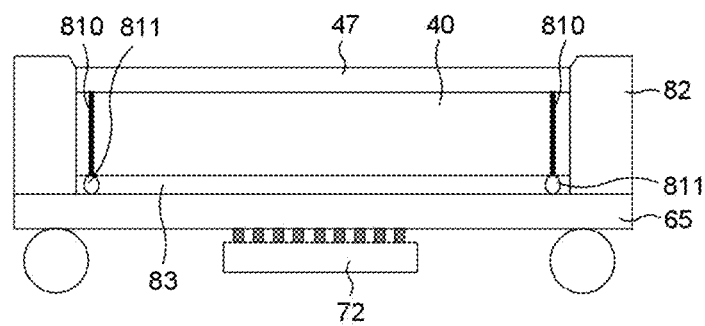
FIG. 3e is a package structure associated with a capacitive sensor according to a tenth embodiment of the present invention.

FIG. 3e shows a schematic diagram of a capacitive fingerprint sensor packaged with a double-sided thin substrate according to a tenth embodiment of the present invention. Basically, the structure of this embodiment is similar to that of the ninth embodiment, with an additional stiffener metal ring 82 and an additional under-fill adhesive layer 83. Further, a hard coating implemented by a ceramic adhesive is also used as the protection layer 47. The double-sided thin substrate 65 implemented by an organic substrate may be completed by an organic solderabillity preservatives (OSP) double-sided substrate.

Figure 3F:
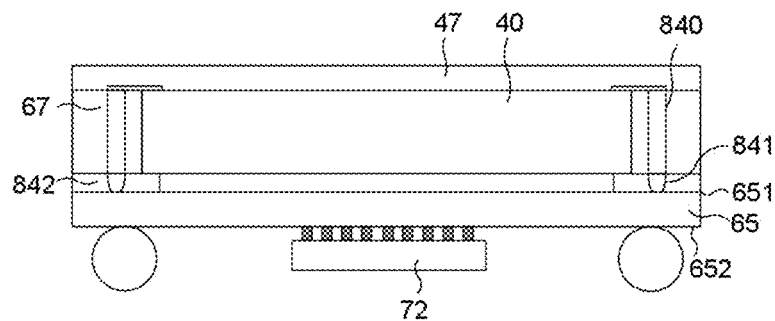
FIG. 3f is a package structure associated with a capacitive sensor according to an eleventh embodiment of the present invention.

FIG. 3f shows a schematic diagram of a capacitive fingerprint sensor packaged with a double-sided thin substrate according to an eleventh embodiment of the present invention. One main difference between the eleventh embodiment and the tenth embodiment is that, the through-silicon vias (TSV) 810 and the copper pillar structure 811 are replaced by through-mold vias (TMV) 840 and pre-solder structures 841. The TMV 840 passes through the protection structure 67 formed by a molding compound or a packaging liquid compound. Further, between the protection structure 67 and the double-sided thin substrate 65 implemented by an organic substrate is an adhesive layer 842, which ensures the binding reliability. Details of the remaining part are substantially identical, and shall be omitted herein. Similarly, the protection layer 47 in this embodiment may be a hard coating implemented by an additional ceramic adhesive, or may be completed using the same material when completing the above protection structure 67. The double-sided thin substrate 65 implemented by an organic substrate may be completed by an OSP double-sided substrate.

Figure 3G:
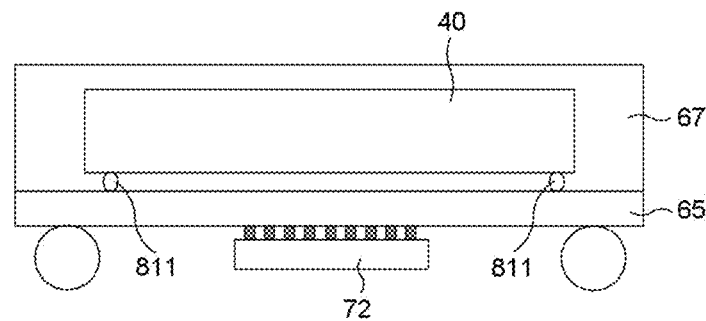
FIG. 3g is a package structure associated with a capacitive sensor according to a twelfth embodiment of the present invention.

FIG. 3g shows a schematic diagram of a capacitive fingerprint sensor packaged with a double-sided thin substrate according to a twelfth embodiment of the present invention. Fundamentally, the structure of this embodiment is similar to that of the ninth embodiment. One main difference is that, the substrate 40 and the multilayer wire structure are assembled in a face-down way, and electrical connection with the doubled-side thin substrate implemented by an organic substrate is completed using the copper pillar structure 811. Details of the remaining part are substantially identical, and shall be omitted herein. Similarly, the protection structure 67 in this embodiment is formed by a molding compound or a packaging liquid compound. The double-side thin substrate 65 implemented by an organic substrate is completed by an OSP double-sided substrate.

Figure 3H:
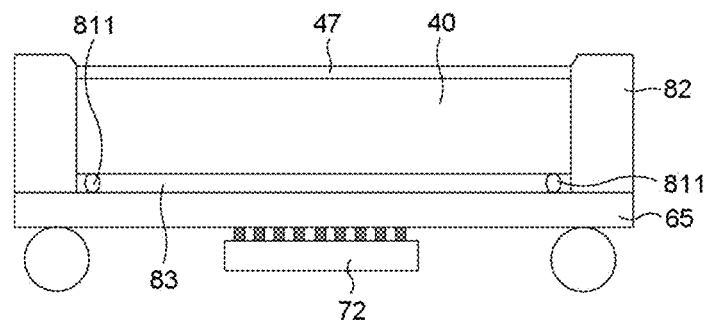
FIG. 3h is a package structure associated with a capacitive sensor according to a thirteenth embodiment of the present invention.

FIG. 3h shows a schematic diagram of a capacitive fingerprint sensor packaged with a double-sided thin substrate according to a thirteenth embodiment of the present invention. Basically, the structure of this embodiment is similar to that of the tenth embodiment, and similarly includes a stiffener metal ring 82 and an under-fill adhesive layer 83. One main difference is that, the substrate 40 and the multilayer wire structure are assembled in the face-down way, and electrical connection with the doubled-side thin substrate implemented by an organic substrate is completed using the copper pillar structure 811. Details of the remaining part are substantially identical, and shall be omitted herein. Similarly, the protection layer 47 in this embodiment may be a hard coating implemented by an additional ceramic adhesive, or may be completed using the same material when completing the above protection structure 67. The double-sided thin substrate 65 implemented by an organic substrate may be completed by an OSP double-sided substrate.

Figure 3I:
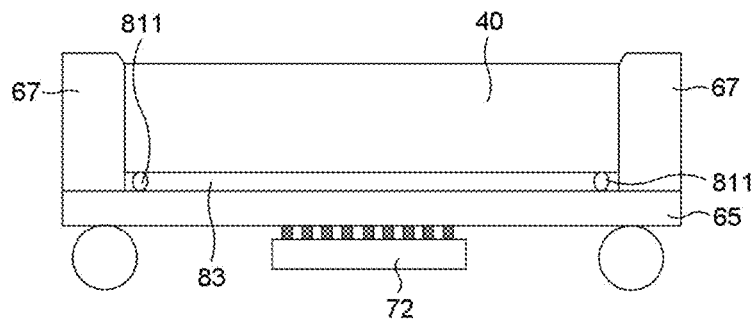
FIG. 3i is a package structure associated with a capacitive sensor according to a fourteenth embodiment of the present invention.

FIG. 3i shows a schematic diagram of a capacitive fingerprint sensor packaged with a double-sided thin substrate according to a fourteenth embodiment of the present invention. Basically, the structure of this embodiment is similar to that of the eleventh embodiment, and similarly includes the protection structure 67 formed by a molding compound or a packaging liquid compound. One main difference is that, the substrate 40 and the multilayer wire structure are assembled in the face-down way, and electrical connection with the doubled-side thin substrate implemented by an organic substrate is completed using the copper pillar structure 811. Details of the remaining part are substantially identical, and shall be omitted herein. The double-side thin substrate 65 implemented by an organic substrate is completed by using an OSP double-sided substrate.

Figure 3J:
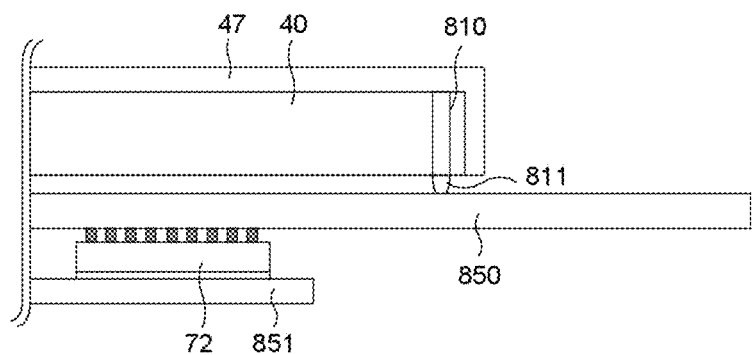
FIG. 3j is a package structure associated with a capacitive sensor according to a fifteenth embodiment of the present invention.

FIG. 3j shows a schematic diagram of a capacitive fingerprint sensor packaged with a double-sided thin substrate according to a fifteenth Basically, the structure of the this embodiment is similar to that of the ninth embodiment. One main difference is that, the double-sided thin substrate 65 implemented by an organic substrate is replaced by a flexible substrate such as a chip-on-flex (COF) or a rigid-flex printed circuit (RFPC) 850, and a support metal plate 851 is disposed below the semiconductor chip 72. Details of the remaining part are substantially identical to those in FIG. 3d, and shall be omitted herein.

Figure 3K:
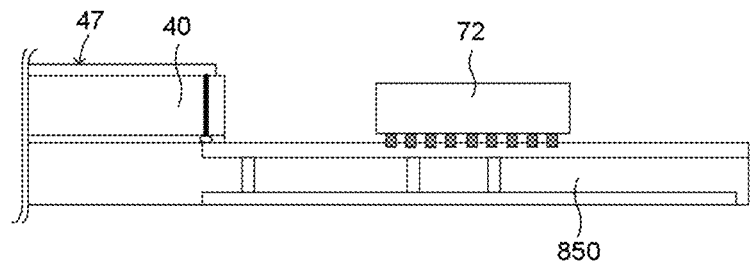
FIG. 3k is a package structure associated with a capacitive sensor according to a sixteenth embodiment of the present invention.
Figure 3I:
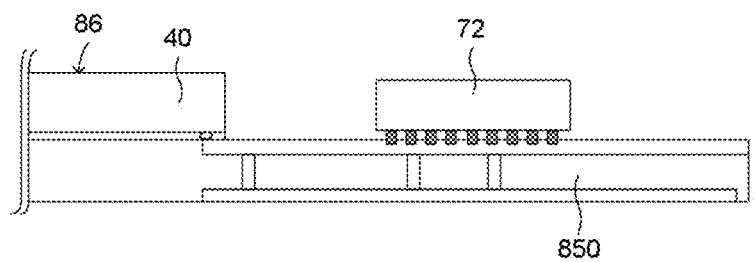

FIG. 3k shows a schematic diagram of a capacitive fingerprint sensor packaged with a double-sided thin substrate according to a sixteenth Basically, the structure of the this embodiment is similar to that of the fifteenth embodiment. That is, the substrate 40 and the multilayer wire structure are assembled in the face-down way, and electrical connection with the doubled-side thin substrate implemented by an organic substrate is completed using the copper pillar structure 811. One main difference is that, the substrate 40 and the semiconductor chip 72 are located at the same side of the COF (or RFPC) 850. Details of the remaining part are substantially identical, and shall be omitted herein.

FIG. 3l shows a schematic diagram of a capacitive fingerprint sensor packaged with a double-sided thin substrate according to a seventeenth Basically, the structure of the this embodiment is similar to that of the sixteenth embodiment. That is, the substrate 40 and the semiconductor chip 72 are located at the same side of the COF (or RFPC) 850. One main difference is that, the hard coating formed by a ceramic adhesive is replaced by a back-side protection layer 86.

Figure 4A:
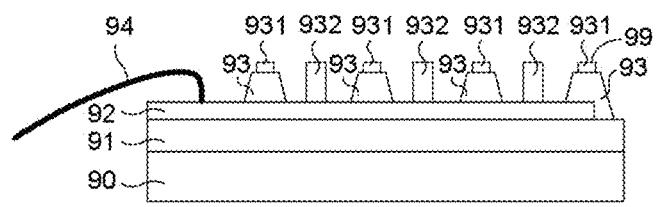
FIG. 4a is a schematic diagram of a multilayer wire structure of the present invention.

FIG. 4a, FIG. 4b, FIG. 4c and FIG. 4d show schematic diagrams of a multilayer wire structure completed by an RDL process. In FIG. 4a, an insulation layer 91 of a silicon oxide layer and a copper layer 92 are formed on a silicon substrate 90 (the substrate 40), an insulation protection layer material 93 is disposed on the copper layer 92, and first-group electrodes 931 and second-group electrodes 932 are formed on the insulation protection layer material 93 and the copper layer 92 in the middle, respectively. As such, a sensing circuit implemented by the multilayer wire structure of the foregoing embodiments can be manufactured. A bonding wire 94 may be electrical connected to the copper layer 92, and a bonding wire 99 may be in electrical contact with the first-group electrodes 931. The multilayer wire structure may be additionally covered by the abovementioned protection layer 27, which is not shown in this diagram.

Figure 4B:
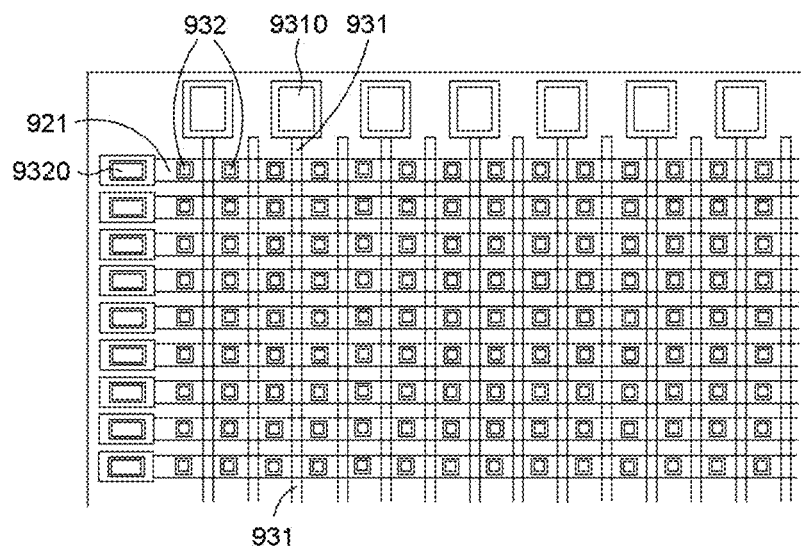
FIG. 4b is a top view of a multilayer wire structure of the present invention.

FIG. 4b shows a top view of FIG. 4a. It is seen that, the copper layer 92 is defined into multiple independent conducting wires 921, each of which being electrically conducted to the second-group electrodes 932 located at the same row. The bonding wire 99 and the bonding wire 94 may be in electrical contact with the first-group electrodes 931 and the second-group electrodes 932 via the revealed bonding pads 9310 and 9320 in the diagram, respectively. The bonding pads 9310 and 9320 may also be disposed at the other side of the silicon substrate 90 with through-base vias (TBVs) to satisfy various packaging flexibility requirements.

Figure 4C:
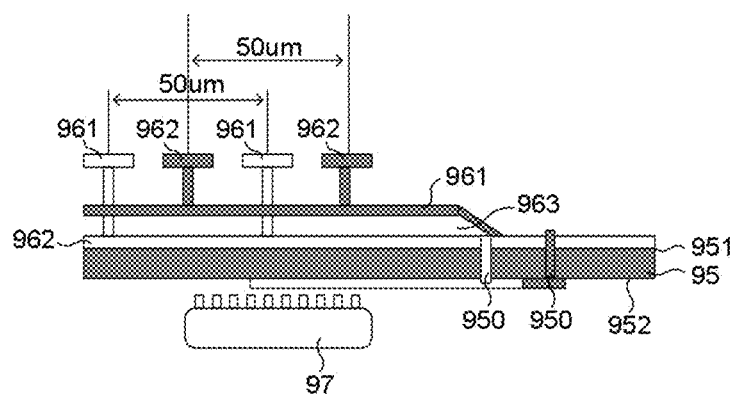
FIG. 4c a schematic diagram of another multilayer wire structure of the present invention.

FIG. 4c shows another schematic diagram of a multilayer wire structure completed on a substrate. First-group electrodes 961 and second-group electrodes 962 are alternately formed at a gap 50 on an upper surface 951 of a substrate 95 (the substrate 40). The first-group electrodes 961 and the second-group electrodes 962 may be separated by an insulation layer 963. Through conducting holes 950 passing through the substrate 95, the first-group electrodes 961 and the second-group electrodes 962 may be electrically connected to a semiconductor layer 97 at a lower surface 952 of the substrate 95.

Figure 4D:
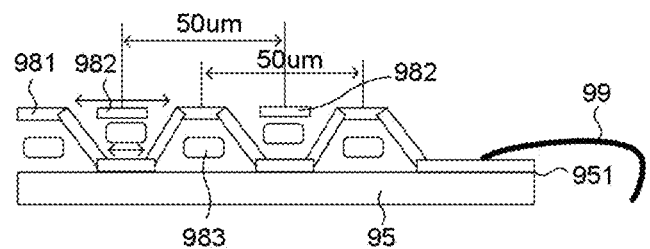
FIG. 4d is a schematic diagram of another multilayer wire structure of the present invention.

FIG. 4d shows a schematic diagram of another multilayer wire structure completed on a substrate. First-group electrodes 981 and second-group electrodes 982 are alternately formed at a gap 50 on the upper surface 951 of the substrate 95 (the substrate 40). The first-group electrodes 981 and the second-group electrodes 962 may be separated by an insulation structure 983. The bonding wire 99 may be electrically connected to the first-group electrodes 981 or the second-group electrodes 982.

To adapt to applications of other devices, the substrate may also be a flexible substrate, e.g., a thin substrate, a flexible printed circuit (FPC), or a substrate made of a flexible glass substrate. Thus, the present invention may be extensively applied to wearable devices.

In conclusion, the present invention is capable of overcoming the issues of excessively high costs of the prior art, and may be extensively applied to various and versatile appearances while maintaining good design flexibilities.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitive fingerprint sensor structure, comprising:
   a substrate;
   a semiconductor chip, comprising a fingerprint sensing controller circuit; and
   a redistribution layer (RDL), disposed on said substrate and electrically connected to said semiconductor chip, comprising:
   a first wire, longer than an orthographic projection of said semiconductor chip;
   a second wire, longer than said orthographic projection; and
   a dielectric material, disposed between said first wire and said second wire,
   wherein said RDL is a passive capacitance sensing circuit used by said fingerprint sensing controller circuit.

2. The capacitive fingerprint sensor structure according to claim 1, wherein said RDL is formed by at least one of an un-doped intrinsic semiconductor material, a precision high-purity alumina ceramic substrate, a packaging molding material, and a packaging liquid material.

3. The capacitive fingerprint sensor structure according to claim 1, wherein the semiconductor chip is electrically connected to said RDL on the substrate by a flip-chip method and via at least one bonding pad structure.

4. The capacitive fingerprint sensor structure according to claim 3, wherein the substrate further comprises an interconnection terminal and a stiffener metal ring formed on said RDL.

5. The capacitive fingerprint sensor structure according to claim 3, wherein the substrate further comprises at least one through-base via (TBV) to electrically conduct on said RDL and the semiconductor chip, a protection layer is further disposed above an upper surface of the substrate, and the protection layer is formed by one of a ceramic adhesive and a hard coating.

6. The capacitive fingerprint sensor structure according to claim 1, wherein the substrate further comprises a through-base via (TBV), the semiconductor chip is electrically connected to the TBV on the substrate via at least one bonding wire, a protection layer is further disposed above an upper surface of the substrate, and the protection layer is formed by one of a ceramic adhesive and a hard coating.

7. The capacitive fingerprint sensor structure according to claim 1, further comprising:
 a circuit board, comprising:
  a first surface, attached to the substrate;
  a second surface, attached to the semiconductor chip; and
  via, electrically connecting the semiconductor chip to the RDL.

8. The capacitive fingerprint sensor structure according to claim 7, wherein said RDL is formed by at least one selected from a group consisting of an un-doped intrinsic semiconductor material, a precision high-purity alumina ceramic substrate, a packaging molding material, and a packaging liquid material.

9. The capacitive fingerprint sensor structure according to claim 7, wherein the semiconductor chip is electrically connected to the via of the circuit board by a flip-chip method and via at least one bonding pad structure, and between the semiconductor chip and the circuit board is filled with an under-fill adhesive layer.

10. The capacitive fingerprint sensor structure according to claim 7, wherein the semiconductor chip is electrically connected to the via on the circuit board via at least one first bonding wire, and the first bonding wire and the semiconductor chip are enclosed by a protection structure.

11. The capacitive fingerprint sensor structure according to claim 7, wherein said RDL comprises a revealed bonding region, which is electrically connected to the first surface of the circuit board via a second bonding wire.

12. The capacitive fingerprint sensor structure according to claim 1, further comprising:
 a packaging substrate, disposed below the substrate; and
 a protection layer, disposed above the packaging substrate, at least enclosing a part of the substrate and the RDL.

13. The capacitive fingerprint sensor structure according to claim 12, wherein the packaging substrate is an organic substrate comprising a first surface and a second surface, the substrate is disposed above the first surface, a third surface of the semiconductor chip is fixedly connected to the substrate via a film-over-wire (FOW), a fourth surface of the semiconductor chip is electrically connected to the first surface via at least one first bonding wire, and the third surface of the semiconductor chip is electrically connected to the first surface via at least one second bonding wire.

14. The capacitive fingerprint sensor structure according to claim 12, wherein the packaging substrate is an organic substrate comprising a first surface and a second surface, the substrate is disposed on the first surface, the semiconductor chip is electrically connected to the second surface of the organic substrate by a flip-chip method and via at least one bonding pad structure, and said RDL is electrically connected to the first surface via at least one first bonding wire.

15. The capacitive fingerprint sensor structure according to claim 12, wherein the packaging substrate is a flexible substrate comprising a first surface and a second surface, the substrate is disposed on the first substrate, the semiconductor chip is electrically connected to the second surface of the organic substrate by a flip-chip method and via at least one bonding pad structure, said RDL is electrically connected to the first surface via at least one first bonding wire.

16. The capacitive fingerprint sensor structure according to claim 15, further comprising a support metal plate disposed at one side of the semiconductor chip.

17. The capacitive fingerprint sensor structure according to claim 12, wherein the packaging substrate is a flexible substrate comprising a first surface and a second surface, the substrate is disposed on the first surface, the semiconductor chip is electrically connected to the first surface of the organic substrate by a flip-chip method and via at least one bonding pad structure, and said RDL is electrically connected to the first surface via at least one first bonding wire.

* * * * *